United States Patent
Tae et al.

(10) Patent No.: US 6,403,461 B1
(45) Date of Patent: Jun. 11, 2002

(54) METHOD TO REDUCE CAPACITANCE BETWEEN METAL LINES

(75) Inventors: Kim-Hyun Tae, Orlando, FL (US); Chok-Kho Liep; Choi-Byoung Il, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/912,606

(22) Filed: Jul. 25, 2001

(51) Int. Cl.[7] ............................................. H01L 21/4763
(52) U.S. Cl. .................... 438/619; 438/622; 438/624; 438/625; 438/631; 438/638
(58) Field of Search ................................. 438/619, 638, 438/637, 622, 623, 624, 625, 626, 627, 629, 631, 633, 634, 672, 675

(56) References Cited

U.S. PATENT DOCUMENTS

| | | | |
|---|---|---|---|
| 5,158,910 A | * 10/1992 | Cooper et al. | 148/DIG. 106 |
| 5,324,683 A | 6/1994 | Fitch et al. | 437/65 |
| 5,559,055 A | 9/1996 | Chang et al. | 437/195 |
| 5,599,745 A | * 2/1997 | Reinberg | 438/624 |
| 5,710,061 A | * 1/1998 | Cleeves | 430/313 |
| 5,837,618 A | 11/1998 | Avanzino et al. | 438/778 |
| 5,882,963 A | 3/1999 | Kerber et al. | 438/195 |
| 5,949,143 A | 9/1999 | Bang | 257/758 |
| 6,057,224 A | 5/2000 | Bothra et al. | 438/619 |
| 6,130,151 A | 10/2000 | Lin et al. | 438/619 |
| 6,159,845 A | 12/2000 | Yew et al. | 438/637 |
| 6,252,290 B1 | * 6/2001 | Quek et al. | 257/522 |
| 6,309,946 B1 | * 10/2001 | Givens | 438/421 |

* cited by examiner

Primary Examiner—Tuan H. Nguyen
Assistant Examiner—Thanhha Pham
(74) Attorney, Agent, or Firm—George O. Saile; Stephen B. Ackerman

(57) ABSTRACT

A process for reducing device capacitance via inclusion of an air gap in a low dielectric constant (low k), layer, used to fill narrow spaces between metal lines, has been developed. The process features the formation of dual damascene metal lines, comprised with a narrow space between the top portions of the dual damascene metal structures, and a wider space between bottom portions of these same structures. Deposition of a low k layer, using a deposition procedure lacking acceptable conformality properties, results in the narrow space between top portions of the dual damascene metal structures being completely filled with low k layer, while the wider space located between bottom portions of the metal structures remains unfilled. The unfilled portion of the low k layer now features an embedded air gap, resulting in decreased capacitance for the dielectric layer located between metal lines, thus reducing performance degrading RC delays.

27 Claims, 4 Drawing Sheets

METHOD TO REDUCE CAPACITANCE BETWEEN METAL LINES

BACKGROUND OF THE INVENTION (1) Field of the Invention

The present invention relates to methods used to fabricate semiconductor devices, and more specifically to a method used to reduce device capacitance presented by dielectric material located between metal lines.

(2) Description of Prior Art

The advent of micro-miniaturization, or the ability to fabricate semiconductor devices comprised with sub-micron features, have allowed fabrication costs to be reduced as a result of obtaining a greater number of smaller semiconductor chips from a specific size starting semiconductor wafer, however with the smaller semiconductor chips still featuring performance equal to or greater than larger counterpart semiconductor chips, formed using larger features. However in some cases the use of smaller device features can deleteriously influence device performance in regards to increased resistance—capacitance (RC), delays. One such example is presented by the decreased spacing between metal interconnect structures is higher capacitance, when compared to the capacitance observed for devices formed with larger spaces between metal lines. The use of dielectric layers, with lower dielectric constants, thus lower capacitance, can be used in the narrowing spaces between metal lines, however these type of dielectric layers can present other problems, such as difficulties in deposition mode or poor conformality.

This invention will describe a novel procedure used to decrease device capacitance, specifically occurring as a result of the narrow spaces between metal lines, in terms of providing an air gap located in a portion of the dielectric layer used in the space between metal lines. Prior art, such as Yew et al, in U.S. Pat. No. 6,159,845, describe a process for an air gap between metal structures, however that prior art, unlike the present invention, has to use an overlying insulator layer, a planarization procedure, and photolithographic and etching procedures, to expose portions of the surface of the metal lines.

SUMMARY OF THE INVENTION

It is an object of this invention to decrease the capacitance of the dielectric material located in the narrow spaces between metal lines.

It is another object of this invention to decrease the capacitance of the dielectric material located in the narrow spaces between metal lines by forming an air gap in the portion of dielectric material located in the space between the metal lines.

It is still another object of this invention to form the air gap in the portion of dielectric material located in the space between the metal lines by depositing a low dielectric constant layer, using a mode of deposition with poor conformality characteristics, thus resulting in pinching of the thick portions of dielectric layer deposited on the sides of top portions of the metal lines, and leaving an air gap in the space between the thinner portions of dielectric layer formed on the sides of bottom portions of the metal lines.

In accordance with the present invention a process for forming a dielectric layer for passivation of metal lines, featuring an air gap formed in a portion of the dielectric layer located in a narrow space between metal lines, has been developed. After deposition of a thin silicon nitride layer on an underlying lower level metal interconnect structure, a composite insulator layer is deposited. Dual damascene openings are next formed in a composite insulator layer, and in the thin silicon nitride layer, with each dual damascene opening comprised of an overlying trench shape component, and an underlying, narrower in width, via opening component. After formation of metal structures in the dual damascene openings, the composite insulator layer surrounding the metal structures is selectively removed, exposing a portion of the thin silicon nitride layer located between the damascene type metal structures. A low dielectric constant layer is then deposited using a mode of deposition characterized by poor conformality features. Deposition of the dielectric layer on the sides of the wide component of the dual damascene type, metal structure, results in pinching, or closure of the narrow space between the wide components of the metal structures, completing the dielectric passivation procedure. The same deposition procedure also results in deposition on the sides of the narrow component of the dual damascene type metal structures, however the larger space between these components, in addition to the poor coverage characteristics of the dielectric passivation procedure, results in a desired air gap in the portion of dielectric layer located between the narrow width components of the metal structures. Planarization procedures are then used to expose the top surface of the dual damascene, metal structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
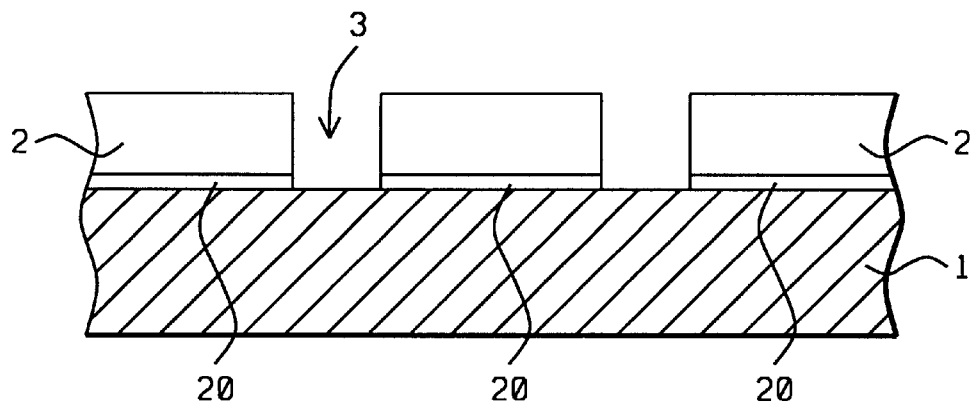
FIGS. 1–10, which schematically, in cross-sectional style, describe key stages of forming a low k layer, in narrow spaces between damascene type metal lines, and featuring an air gap located in a bottom portion of the low k layer, located in wide spaces between the damascene type metal lines.

The method of decreasing device capacitance via use of a low k passivation layer, featuring an air gap established in a portion of the low k layer located between metal lines, will now be described in detail. Conductive structure 1, comprised of metal such as aluminum, aluminum-copper, copper, or tungsten, is shown schematically in FIG. 1. Conductive structure 1, can also be a diffused region in a semiconductor substrate, such as a heavily doped source/drain region. Thin silicon nitride layer 20, is next deposited via plasma enhanced chemical vapor deposition (PECVD), procedures, to a thickness between about 400 to 600 Angstroms, using a deposition temperature between about 350 to 400° C. Silicon nitride layer 20, will protect conductive structure 1, from subsequent HF type procedures. An inter-metal dielectric (IMD), layer 2, is next deposited on thin silicon nitride layer 20. IMD layer 2, can be comprised of silicon oxide, or of boro-phosphosilicate glass (BPSG), obtained via low pressure chemical vapour deposition (LPCVD), or plasma enhanced chemical vapour deposition (PECVD), procedures, at a thickness between about 6,000 to 11,000 Angstroms. Photolithographic and anisotropic, reactive ion etching (RIE), procedures, using $CHF_3$ or $CF_4$ as an etchant for IMD layer 2, are employed to form via openings 3, in IMD layer 2, and in thin silicon nitride layer 20, exposing portions of the top surface of conductive structure 1. This is schematically shown in FIG. 1. Removal of the photoresist shape used for definition of via openings 3, is accomplished using plasma oxygen ashing and careful wet cleans.

Figure 2:
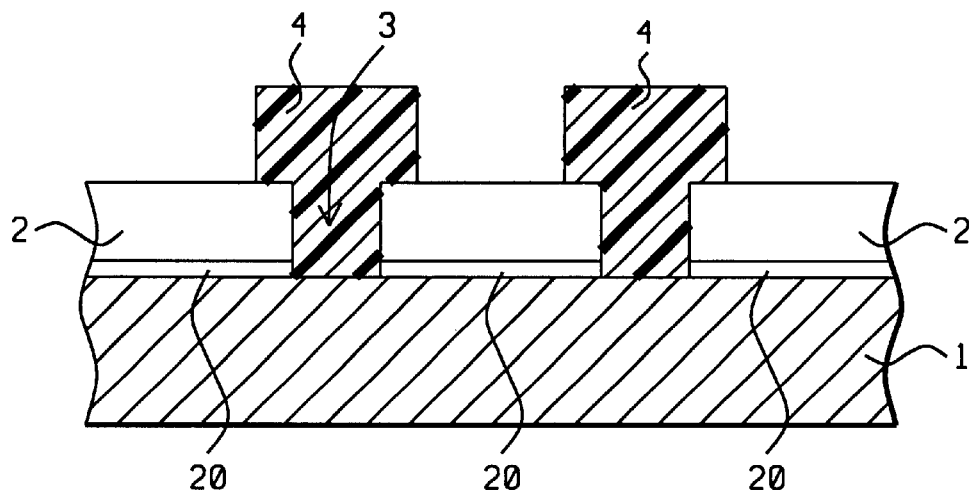
Figure 3:
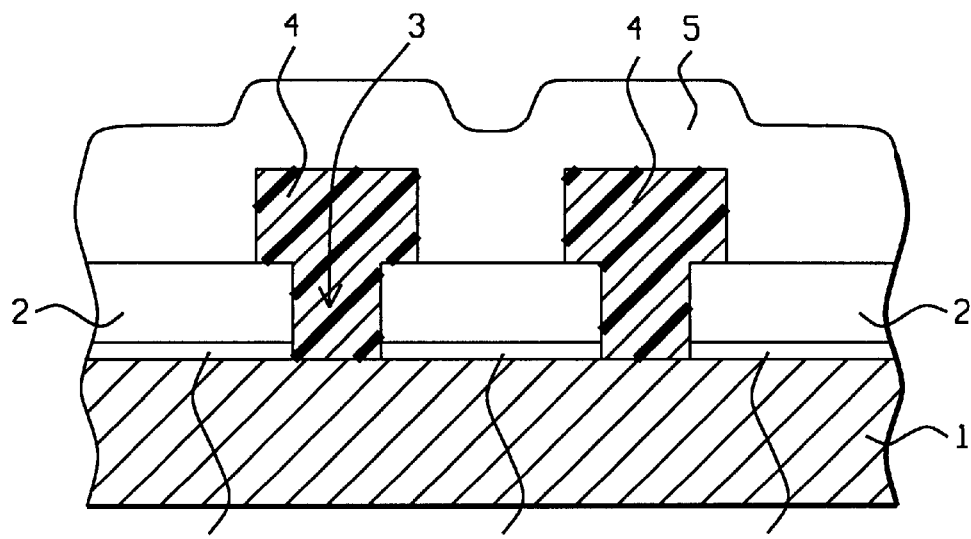
Figure 4:
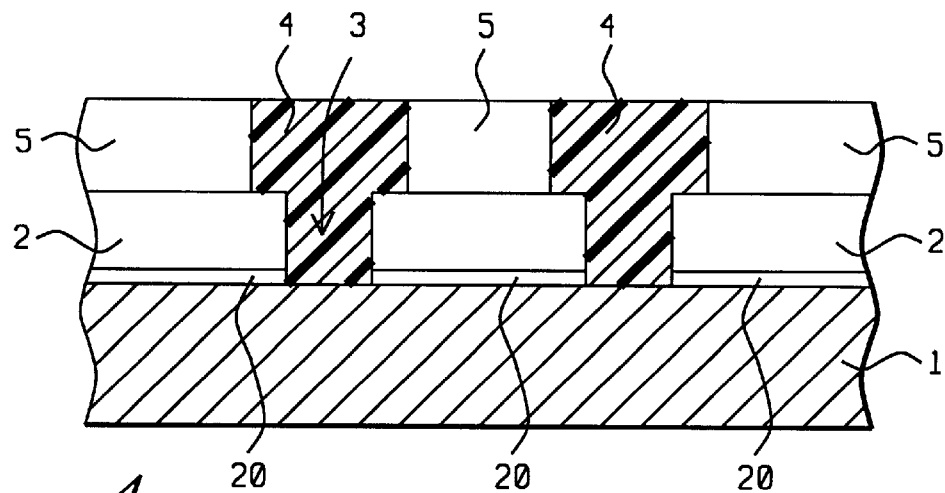

Photoresist shapes 4, shown schematically in FIG. 2, are next formed with the bottom portion of photoresist shaped 4, completely filling via openings 3, while top portions of the photoresist shapes, at a width greater than 15000 Angstroms, reside on portions of the top surface of IMD layer 2. Insulator layer 5, is next deposited or applied, completely covering photoresist shapes 4. Insulator layer 5, at a thickness between about 20,000 to 24,000 Angstroms, is either comprised of a low temperature silicon oxide layer, obtained via PECVD procedures, at a temperature less than 250° C., or comprised of a spin on glass (SOG), silicon oxide layer, applied at a temperature less than 250° C. The low temperature use for attainment of insulator layer 5, allows photoresist shaped 4, to remain unchanged. This is schematically shown in FIG. 3. Planarization of insulator layer 5, is next addressed via a chemical mechanical polishing (CMP), procedure, or via a selective dry etching procedure using $CHF_3$ as an etchant for insulator layer 5. The planarization procedure is terminated at the appearance of the top surface of photoresist shapes 4. This is schematically shown in FIG. 4.

Figure 5:
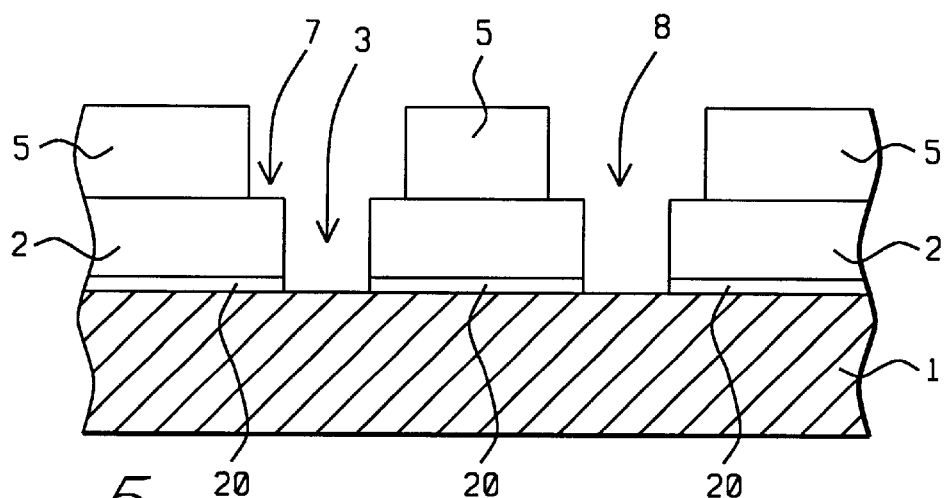
Figure 6:
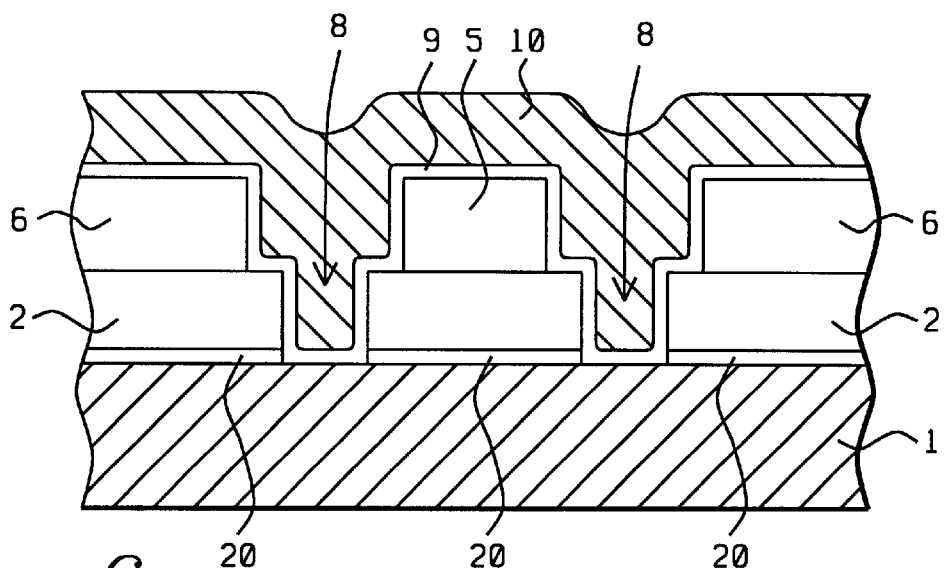
Figure 7:
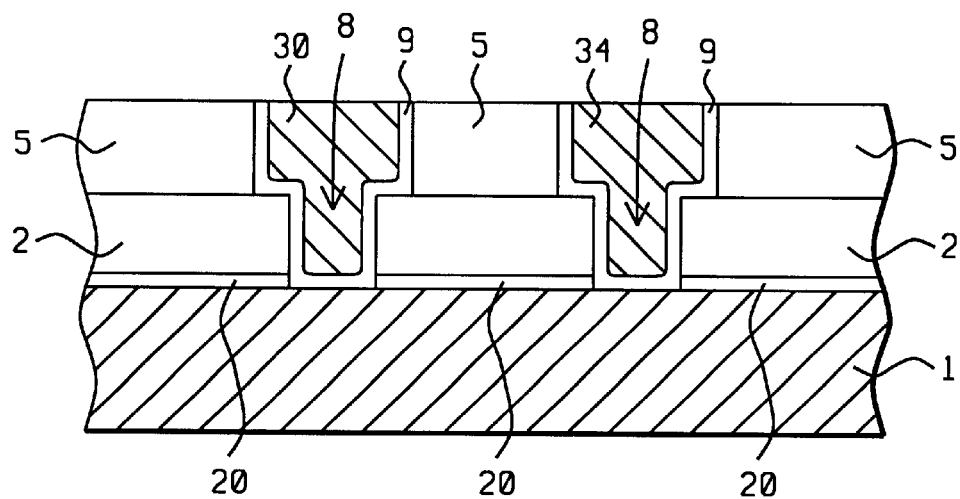

Removal of photoresist shapes 4, is next accomplished via plasma oxygen ashing procedures, resulting in a dual damascene type opening 8, comprised of trench opening 7, in insulator layer 5, and comprised of underlying via openings 3, in IMD layer 2. This is shown schematically in FIG. 5. Barrier layer 9, comprised of titanium nitride, or tantalum nitride, is next deposited via physical vapour deposition (PVD), or chemical vapour deposition (CVD), procedures, to a thickness between about 200 to 500 Angstroms, completely contouring the surfaces of dual damascene opening 8. Metal layer 10, comprised of a metal such as copper, aluminum or aluminum-copper, tungsten, or tungsten silicide, is then deposited completely filling dual damascene openings 8. This is shown schematically in FIG. 6. Metal layer 10, is obtained via CVD or via electroplating procedures, at a thickness between about 5,000 to 8,000 Angstroms. A second planarization procedure, again via use of either a CMP procedure, or via use of a selective dry etching procedure, is employed to remove portions of metal layer 10, and of barrier layer 9, resulting in the dual damascene metal structures 30, located in dual damascene openings 8. This is schematically shown in FIG. 7. The second planarization procedure is terminated at the appearance of the top surface of insulator layer 5. If the selective dry etching option is employed for the second planarization procedure, $Cl_2$ or $SF_6$ is used as a selective etchant for metal layer 10, and for barrier layer 9.

Figure 8:
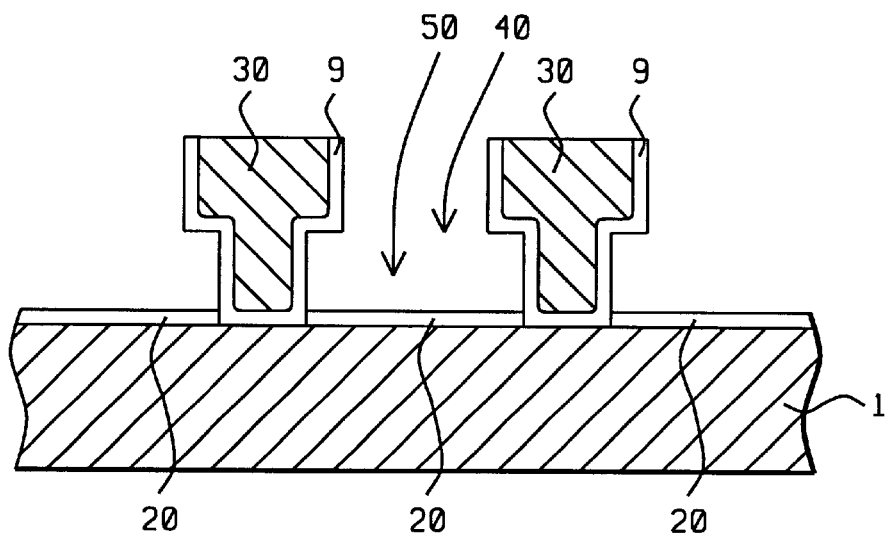

A selective wet etch procedure, using either a buffered hydrofluoric (BHF), or a dilute hydrofluoric (DHF), acid solution is employed to completely remove insulator layer 5, and IMD layer 2, resulting in the dual damascene metal structures 30, now not embedded in insulator, located overlying conductive structure 1. Thin silicon nitride layer 20, was not removed during this selective wet etch procedure, thus protecting conductive structure 1, from the deleterious effects the selective wet etch procedure can impart on an exposed metal surface. A narrow space 40, less than 1500 Angstroms in width, is located between the top portions of dual damascene metal structures 30, while a wider space 50, greater than 1600 Angstroms, is located between the bottom portions of dual damascene metal structures 30. This is schematically shown in FIG. 8.

Figure 9:
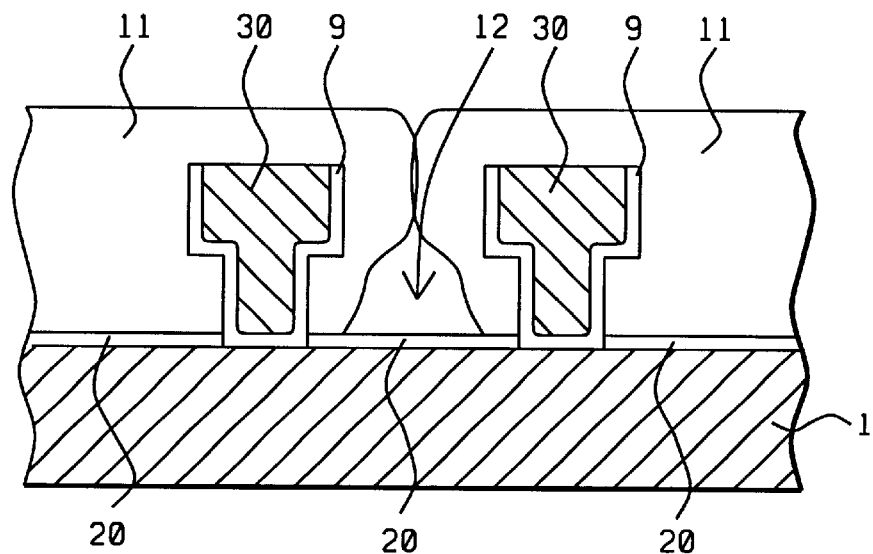
Figure 10:
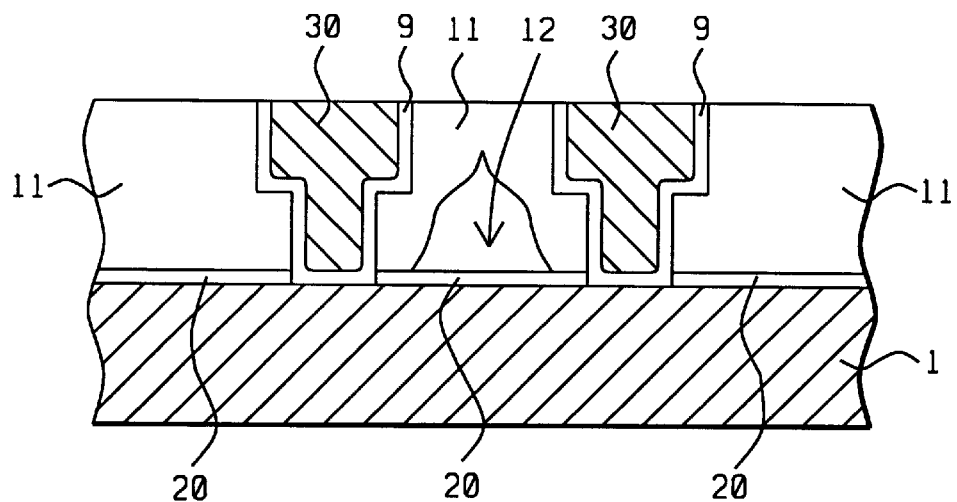

The low dielectric constant (low k), layer, used for passivation of dual damascene metal structures 30, is next addressed and schematically described in FIGS. 9–10. Low k layer 11, comprised of a dielectric layer such as a fluorinated silica glass (FSG), with a dielectric constant between about 3.5 to 3.8, is next deposited to a thickness between about 20,000 to 24,000 Angstroms, using PECVD procedures. The use of PECVD procedures, at a temperature between about 350 to 450° C., results in poor conformality, or poor coverage, allowing narrow space 40, located between the top portions of dual damascene metal structures 30, to close, or pinch off, before wider space 50, located between the bottom portions of dual damascene metal structures 30, can be filled. This results in air gap 12, located in the bottom portion of low k layer 11, again located in wide space 50, between bottom portions of dual damascene metal structures 30. This is schematically shown in FIG. 9. Air gap 12, with a dielectric constant of 1, will allow the capacitance between metal lines to be decreased when compared to counterparts in which the entire space between metal lines are insulator filled. This results in the desired lowering of the RC delays, allowing the desired increased device performance to be achieved. Finally a third planarization procedure, again via use of CMP or selective dry etching procedures, is employed to remove low k layer from the top surface of dual damascene metal structures 30. This is schematically shown in FIG. 10. The dry etching option for the third planarization procedure is accomplished using $CHF_3$, or $CF_4$, as an etchant for low k layer 11.

While this invention has been particularly shown and described with reference to, the preferred embodiments thereof, it will be understood by those skilled in the art that various changes in form and details may be made without departing from the spirit and scope of this invention.

What is claimed is:

1. A method of forming a low dielectric constant (low k) layer, on a semiconductor substrate, comprising the steps of:

providing a conductive structure on said semiconductor substrate;

depositing a silicon nitride layer on said conductive structure;

forming dual damascene type openings in a composite insulator layer and in said silicon nitride layer with said composite insulator layer overlying said silicon nitride layer, said damascene type openings exposing portions of said conductive structure with each of dual damascene type openings comprised of a wide trench opening and an underlying narrow via opening, said wide trench opening being in a second insulator layer of said composite insulator layer and said narrow via opening being in a first insulator layer of said composite insulator layer and said silicon nitride layer;

forming dual damascene metal structures in said dual damascene type openings;

removing said composite insulator layer, exposing said silicon nitride layer located between said dual damascene metal structures;

depositing said low k layer thereby filling a narrow first space located between side top portions of said dual damascene metal structures and partially filling a second wide space located between side bottom portions of said dual damascene metal structures, leaving an air gap in partially filled wide second space; and removing said low k layer from top surface of said dual damascene metal structures resulting in said low k layer located between said dual damascene metal structures with said air gap located in a bottom portion of said low k layer and in said second wide space between said bottom side portions of said dual damascene metal structures.

2. The method of claim 1, wherein said conductive structure is a metal structure comprised of aluminum, aluminum-copper, copper, or tungsten.

3. The method of claim 1, wherein said silicon nitride layer is deposited by plasma enhanced chemical vapor deposition procedures, at a thickness between about 400 to 600 Angstroms.

4. The method of claim 1, wherein said first insulator layer is comprised of silicon oxide or boro-phosphosilicate glass obtained via LPCVD or PECVD procedures at a thickness between about 6,000 to 11,000 Angstroms, and said second insulator layer is comprised of a low temperature silicon oxide layer obtained by PECVD procedures at a thickness between about 20,000 to 24,000 Angstroms or a spin on glass layer at a thickness between about 20,000 to 24,000 Angstroms.

5. The method of claim 1, wherein said dual damascene metal structures are comprised of a metal such as aluminum, aluminum-copper, copper, or tungsten, obtained by CVD or by electroplating procedures, at a thickness between about 5,000 to 8,000 Angstroms.

6. The method of claim 1, wherein said composite insulator layer is selectively removed by wet etch procedures using buffered hydrofluoric acid, or dilute hydrofluoric acid, as an etchant.

7. The method of claim 1, wherein said narrow first space, located between the top portions of said dual damascene metal structures, is less than 15,000 Angstroms in width.

8. The method of claim 1, wherein said wide second space, located between the bottom portions of said dual damascene metal structures, is greater than 16,000 Angstroms in width.

9. The method of claim 1, wherein said low k layer is a fluorinated silica glass layer, with a dielectric constant between about 3.5 to 3.8, obtained by PECVD procedures, at a thickness between about 20,000 to 24,000 Angstroms.

10. A method of forming a low k layer between dual damascene metal structures, featuring an air gap incorporated into a portion of said low k layer, in turn located in a wide space between the bottom portions of said dual damascene metal structures, comprising the steps of:

providing a metal structure:

depositing a silicon nitride layer on said metal structure;

depositing a first insulator layer on said silicon nitride layer;

forming via openings in said first insulator layer and silicon nitride layer, exposing a portion of the top surface of said metal structure;

forming photoresist shapes in said via openings, with a wide portion of said photoresist shapes overlying a portion of the top surface of said first insulator layer;

depositing a low temperature second insulator layer, covering top surface of said photoresist shapes;

performing a first planarization procedure removing a top portion of said second insulator layer, exposing a top surface of said photoresist shapes;

selectively removing said photoresist shapes resulting in dual damascene type openings comprised of wide width trench type openings in said second insulator layer and narrow width via openings in said first insulator layer and in said silicon nitride layer;

depositing a barrier layer in said dual damascene type openings;

depositing a metal layer completely filling said dual damascene type openings;

performing a second planarization procedure to remove portions of said metal layer and said barrier layer from the top surface of said second insulator layer, resulting in the formation of said dual damascene metal structures located in said dual damascene type openings;

selectively removing said second insulator layer and said first insulator layer from top surface of said silicon nitride layer, resulting said dual damascene metal structures on underlying said metal structure, forming a narrow first space located between side top portions of said dual damascene metal structures, forming a wide second space located between side bottom portions of said dual damascene metal structures;

depositing said low k layer on top surface of said dual damascene metal structures, on the top surface of said silicon nitride layer located between said dual damascene metal structures, on sides of the top portions of said dual damascene metal structures completely filling said narrow first space, and on sides of the bottom portions of said dual damascene metal structures, partially filling said wide second space, resulting in said air gap located in unfilled portion of said wide second space; and performing a third planarization procedure removing portions of said low k layer from the top surface of said dual damascene metal structures.

11. The method of claim 10, wherein said metal structure is comprised of aluminum, aluminum-copper, copper, or tungsten.

12. The method of claim 10, wherein said silicon nitride layer is obtained by PECVD procedures, to a thickness between about 400 to 600 Angstroms.

13. The method of claim 10, wherein said first insulator layer is comprised of silicon oxide or of a boro-phosphosilicate glass, obtained by PECVD or LPCVD procedures, at a thickness between about 6,000 to 11,000 Angstroms.

14. The method of claim 10, wherein said via openings are formed in said first insulator layer, said silicon nitride layer, by an anisotropic reactive ion etching procedure, using $CHF_3$ or $CF_4$ as an etchant.

15. The method of claim 10, wherein said wide portions of said photoresist shapes are comprised with a width greater than 16,000 Angstroms.

16. The method of claim 9, wherein said low temperature second insulator layer is a silicon oxide layer, obtained by PECVD procedures, at a temperature below 250° C., at a thickness between about 20,000 to 24,000 Angstroms.

17. The method of claim 10, wherein said low temperature second insulator layer is a spin on glass silicon oxide layer, applied at a temperature below 250° C., to a thickness between about 20,000 to 24,000 Angstroms.

18. The method of claim 10, wherein said first planarization procedure is performed by chemical mechanical polishing or selective dry etch procedures.

19. The method of claim 10, wherein said photoresist shapes are selectively removed by plasma oxygen ashing procedures.

20. The method of claim 10, wherein said barrier layer is comprised of titanium nitride or tantalum nitride, obtained by plasma vapour deposition (PVD) or chemical vapour deposition (CVD) procedures, at a thickness between about 200 to 500 Angstroms.

21. The method of claim 10, wherein said metal layer is comprised of aluminum, aluminum-copper, copper, or tungsten, obtained by PVD or CVD procedures, at a thickness between about 5,000 to 8,000 Angstroms.

22. The method of claim 10, wherein said second planarization procedure is performed by chemical mechanical polishing or selective dry etch procedures, using $Cl_2$ as an etchant for said barrier layer and for said metal layer.

23. The method of claim 10, wherein said low temperate second insulator layer and said first insulator layer are selectively removed by wet etch procedures, using buffered hydrofluoric acid or dilute hydrofluoric acid as an etchant.

24. The method of claim 10, wherein said narrow first space, located between the top portions of said dual damascene metal structures, is less than 15,000 Angstroms in width.

25. The method of claim 10, wherein said wide second space, located between the bottom portions of said dual damascene metal structures, is greater than 16,000 Angstroms in width.

26. The method of claim 10, wherein said low k layer is a fluorinated silica glass layer, with a dielectric constant between about 3.5 to 3.8, obtained by PECVD procedures, at a thickness between about 20,000 to 25,000 Angstroms.

27. The method of claim 10, wherein said third planarization procedure is performed by chemical mechanical polishing procedures, or by a selective dry etch procedure using $CHF_3$ or $CF_4$ as an etchant for said low k layer.

* * * * *

UNITED STATES PATENT AND TRADEMARK OFFICE
CERTIFICATE OF CORRECTION

PATENT NO.    : 6,403,461 B1
DATED         : June 11, 2002
INVENTOR(S)   : Hyun Tae Kim, Kho Liep Chok and Byoung Choi Il It is certified that error appears in the above-identified patent and that said Letters Patent is hereby corrected as shown below:

<u>Title page,</u>
Item [75], delete "Kim-Hyun Tae" and replace with -- Hyun Tae Kim --, delete "Chok-Kho Liep" and replace with -- Kho Liep Chok --, and delete "Choi-Byoung Il" and replace with -- Byoung Choi Il --.

Signed and Sealed this

Eighth Day of April, 2003

JAMES E. ROGAN
*Director of the United States Patent and Trademark Office*